(12) United States Patent
Callewaert et al.

(10) Patent No.: US 6,346,865 B1
(45) Date of Patent: Feb. 12, 2002

(54) EMI/RFI FILTER INCLUDING A FERROELECTRIC/FERROMAGNETIC COMPOSITE

(75) Inventors: Clyde Maynord Callewaert, Shelby Township, MI (US); Edward Patrick Manning, Niles, OH (US); Joseph Vito Mantese, Shelby Township, Macomb County, MI (US); Dominic Anthony Messuri, Canfield, OH (US); Adolph Louis Micheli, Harrison Township, Macomb County, MI (US); Steven A Musick, Burton; William Thomas Phillips, Jr., Boardman, both of OH (US); Norman William Schubring, Troy; Dennis Forest Dungan, Clinton Township, Macomb County, both of MI (US)

(73) Assignee: Delphi Technologies, Inc., Troy, MI (US)

( * ) Notice: Subject to any disclaimer, the term of this patent is extended or adjusted under 35 U.S.C. 154(b) by 0 days.

(21) Appl. No.: 09/302,104

(22) Filed: Apr. 29, 1999

(51) Int. Cl.$^7$ ................................................. H03H 7/01

(52) U.S. Cl. ........................................ 333/185; 333/184

(58) Field of Search ................................ 333/181, 184, 333/185; 361/270; 336/200

(56) References Cited

U.S. PATENT DOCUMENTS

| 3,035,237 A | 5/1962 | Schlicke ..................... 333/182 |
| 3,243,738 A | 3/1966 | Schlicke et al. ............. 333/182 |
| 3,789,263 A | 1/1974 | Fritz et al. ................. 315/39.51 |

(List continued on next page.)

FOREIGN PATENT DOCUMENTS

| JP | 6-164288 | * | 6/1994 | ................. 333/185 |
| JP | 63-291413 | * | 6/1994 | ................. 333/185 |

OTHER PUBLICATIONS

Shirakawa et al., "Thin Film Inductor with Multilayer Magnetic Core," IEEE 1993.
Microwave Journal, p. 272–273, May 1996.
Macleod, "Radical step towards tiny smt inductor," Jul./Aug. 1990, pp. 45–46, New Electronics.

(List continued on next page.)

*Primary Examiner*—Justin P. Bettendorf
(74) *Attorney, Agent, or Firm*—Thomas A. Twomey

(57) ABSTRACT

An EMI filter (10) that makes use of a ferroelectric-ferromagnetic composite, member, or slab (12) in connection with capacitive and inductive elements. The geometrical structure of the filter (10) is such that the mutually orthogonal electric fields and magnetic fields generated by the capacitive and inductive elements penetrate the volume of the composite (12). In some designs, capacitive plates (14, 18, 32, 34) are split to avoid setting up eddy currents in the plates (14, 18, 32, 34) which oppose the penetration of magnetic flux through the composite (12). Various structural designs can be provided to define the capacitive elements and the inductive elements in different configurations relative to the composite to satisfy the desirable requirements. One particular low-pass design includes providing a slab (12) of the composite with plates (14, 18, 32, 34) on opposite sides of the slab (12) that define capacitors, and a conductive strip (20) wrapped around the slab (12) and electrically connected to the hot capacitive plates (14, 18) that define the inductor. This basic configuration can be extended to a cylinder (52) made of the composite, where a ground plane (56) is provided on one surface (54) of the cylinder (52), and the hot capacitor plates (60, 64) are provided on the other surface (62) of the cylinder (52), where a conductive strip (70) on the other surface (62) defines the coil. A multi-layer filter (76) can be provided that includes layered substrates (78) where metallized vias (80) extending through the substrates (78) define a coil, and ground planes (124) and capacitive plates (112, 114) on alternating substrates (78) define the capacitive elements.

27 Claims, 3 Drawing Sheets

U.S. PATENT DOCUMENTS

| | | | |
|---|---|---|---|
| RE29,258 E | | 6/1977 | Fritz .......................... 333/182 |
| 5,302,932 A | | 4/1994 | Person et al. ................ 336/200 |
| 5,497,129 A | | 3/1996 | Mantese et al. ............ 333/182 |
| 5,512,196 A | | 4/1996 | Mantese et al. ........... 252/62.9 |
| 5,572,180 A | * | 11/1996 | Huang et al. ................ 336/200 |
| 5,601,748 A | | 2/1997 | Mansour et al. |
| 5,856,770 A | | 1/1999 | Mantese et al. ............ 333/182 |
| 6,133,809 A | * | 10/2000 | Tomohiro et al. ........... 333/185 |

OTHER PUBLICATIONS

Huang et al., "The Study of Magnetic Circuit Design for Multilayer Ferrite Chip Inductors," IEEE Transactions on Magnetics, vol. 31, No. 6, Nov. 1995, pp. 4071–4073.

Breen et al., "Multi–layer Inductor for High Frequency Applications," IEEE 1991, pp. 551–554.

"EMISorb Surface Mount Device," Research Disclosure, Jun. 1998, pp. 665–667.

* cited by examiner

EMI/RFI FILTER INCLUDING A FERROELECTRIC/FERROMAGNETIC COMPOSITE

TECHNICAL FIELD

This invention relates generally to an EMI suppressor filter and, more particularly, to a combination capacitive and inductive filter employing a ferroelectric/ferromagnetic composite.

BACKGROUND OF THE INVENTION

Electromagnetic interference (EMI) and radio frequency interference (RFI), typically in the form of stray radio frequency noise, cross-talk between electrical devices, spark discharges, poor or intermittent contact between metal bonds and electrical components, and atmospheric interference, can be a significant problem in the operation and performance of many electrical circuits. This problem becomes increasingly more pronounced as electrical circuits become smaller in size and the electrical components are positioned closer together. Additionally, low level signals in connection with computer systems and the like require better EMI and RFI filtering because the switching electronics in these systems operate at higher voltages.

Series capacitors are typically employed in the art to filter low frequency signals and series inductors are employed to filter high frequency signals and vice versa for shunt elements. State of the art low pass EMI/RFI filters typically include installing shunt capacitors on an electronic circuit board using conventional manufacturing technology. For certain applications, a series inductor is added to provide low pass "LC" filtering, such as when a block inductor is placed in series or parallel with one or more discrete shunt capacitors. The use of refined LC filtering is often necessary because capacitors may exhibit inductance at high frequencies, which can significantly reduce the effectiveness of an electronic device. As electronic devices become more compact, these types of filters take up increasingly valuable space on the circuit board. Furthermore, these filters do not always provide a sufficient level of protection because their passband is a function of frequency, and thus application dependent. As a result, it is often necessary to narrowly tailor the capabilities of such filters to perform well for specific applications.

It is also known in the art to position EMI/RFI filters, such as feed-through filters, at electrical interconnects to suppress cross-talk and other extraneous noise at connector pins. Conventional filters of this type can include a ferroelectric ceramic tube that is plated on its interior and exterior surfaces with a metallic coating that serves as a pair of electrodes. The interior electrode is in electrical contact with a connector pin and the exterior electrode is in electrical contact with ground. The capacitance of the filter depends upon the surface area and thickness of the tube and the dielectric constant, or permittivity, of the ceramic material used. These filter components are adequate for many applications.

It is known in the art to form a ceramic tube out of a ferromagnetic material, such as ferrite, and then sinter a ferroelectric material, such a barium titanate, to the exterior surface of the tube. The ferromagnetic material, characterized by having a high permeability, provide inductance and the ferroelectric material, characterized by having a high permittivity, provides, with the appropriate metallization, capacitance between the ferromagnetic material and ground. As a result, the ferromagnetic and ferroelectric materials act together to provide an LC filter, where the inductive and dissipative capability provided by the ferromagnetic material attenuates the interference which otherwise occurs with the capacitive element at the higher frequencies.

Although the known EMI/RFI filters made in this manner have advantageous features in terms of electromagnetic interference attenuation, multi-component filters are less simple to assemble and are believed to be less expensive to manufacture and store than single element filters.

To simultaneously provide both the capacitive and inductive filtering for EMI/RFI suppression, a number of desirable properties and characteristics for such a filter can be identified. Particularly, a material having a high DC resistivity would prevent shorting between adjacent connector pins; a material having a high dielectric constant would provide improved capacitance; a material having a high permeability would produce inductive capabilities; and a material having a significant mechanical strength would provide for durability in assembling. Some of these properties may be provided by one material and the remaining properties may be provided by another material. However, simply mixing two materials together will not produce a composite that will achieve the desired properties because of high porosity. If the mixture is sintered to remove the porosity, the permittivity/permeability is degraded becoming relatively low. This is because when the two materials are sintered at high temperatures to achieve the desired characteristics referred to above, the materials chemically react with each other resulting in lower permittivity/permeability and resistivity.

Materials are known in the art which exhibit both ferroelectric and ferromagnetic properties. One class of such materials consists of compounds having a single crystalline phase. However, the permeability and permittivity of this group of materials are generally inadequate for technical applications because the optimum magneto-electric properties of these components exist only at temperatures well below room temperature.

A more recently discovered group of magnetoelectric materials are formed from composites of fine grain powders of ferrite and lead zirconate titanate (PZT) which have been sintered together for evaluating magnetostrictive and piezoelectric effects, i.e., the contraction or expansion of a material when subjected to a magnetic or electrical field. However, lead is reactive with the ferrite, yielding a composite having greatly diminished permeability, permittivity, and resistivity as compared to its individual constituent materials. Such losses in constituent properties are well known to those skilled in the art.

A ferroelectric-ferromagnetic composite for use in an EMI/RFI suppression filter has been developed in the art that significantly solves the problems referred to above. Particularly, U.S. Pat. No. 5,497,129 issued Mar. 5, 1996, U.S. Pat. No. 5,512,196 issued Apr. 30, 1996, U.S. Pat. No. 5,601,748 issued Feb. 11, 1997 and U.S. Pat. No. 5,856,770 issued Jan. 5, 1999, all disclose ferroelectric-ferromagnetic composite materials for an EMI/RFI filter. Each of these patents is assigned to the assignee of this application, and are herein incorporated by reference. These patents disclose a ferroelectric-ferromagnetic composite that includes a ferroelectric material and a ferromagnetic material which are combined to form a solid composite material which is capable of suppressing electromagnetic interference in an electrical component or device. The grains of the ferroelectric material and the grains of the ferromagnetic material are combined, intermixed and consolidated to form the composite such that the ferroelectric and ferromagnetic grains substantially retain their respective, discrete electromagnetic properties.

In one embodiment, the ferroelectric material is barium titanate and the ferromagnetic material is a ferrite material, such as a copper zinc ferrite. The solid composite material is combined in a manner that insures that the microstructure of the solid ferroelectric-ferromagnetic composite is characterized by grains which are large enough to maintain their respective ferroelectric or ferromagnetic properties. Detrimental interaction between the ferroelectric and ferromagnetic materials is substantially absent so as to permit the materials to retain their permittivity and permeability properties for the desirable interference suppression.

The ferroelectric material selected for the ferroelectric-ferromagnetic composite is barium titanate ($BaTiO_3$), although other suitable ferroelectric materials could be used, such as barium strontium niobate, and barium copper tantalate. Barium titanate is the preferred material in part because it is a high dielectric material having a large permittivity of about 1000 or higher at about 1 kHz. Further, the permittivity of barium titanate can be enhanced by the addition of dopants.

The ferroelectric material may have a sintering point ranging from about 1300° C. to about 1400° C. The ferroelectric material is chosen to have a sintering temperature above that of the ferromagnetic material, preferably at least about a 250° C. higher sintering point than the ferromagnetic material, so that the ferromagnetic material diffuses around the ferroelectric phase. This allows the advantage of forming a structure of low porosity to provide a material having a higher permeability, permittivity and low dielectric loss. Both the ferroelectric and ferromagnetic materials are evenly distributed through the composite, preferably so that the sintered composite does not contain open pore porosity. This provides the advantage of low dielectric loss. In one embodiment, the ferroelectric-ferromagnetic composite has a closed pore porosity ranging from about 0% to about 10% by volume.

The ferromagnetic material selected for the ferroelectric-ferromagnetic composite is a ferrite, which is a high resistance magnetic material consisting principally of ferric oxide ($Fe_2O_3$) and one or more other oxides. The ferromagnetic material may have an $AB_2O_4$ formula, where component A is selected from the group consisting of Cu, Mg, Zn, Ni and Mn, and component B includes primarily Fe. Component A may also be selected to include a low sintering component that lowers the overall sintering temperature of the ferromagnetic material to about 250° C. less than the ferroelectric component. Copper is the preferred low sintering component. Component A may also be selected to include a high electrical resistivity component such as Mg, so that the electrical resistivity of the composite is at least $10^6$, $10^7$, $10^9$ or $10^{12}$ ohm cm. Mg may also be added as component A to insure high electrical resistivity. Component A may also be chosen to provide a high permeability component such as Zn, so that the permeability is at least 30 at 100 kHz or at least 1 at 100 MHz. The material may also be chosen to provide a high permeability, for example, 100 at 100 kHz. The ferrite is a copper-based ferrite because of the low sintering temperatures associated with such ferrites. Copper zinc magnesium ferrite with excess MgO ($Cu_{0.2}Mg_{0.4}Zn_{0.5}Fe_2O_4$) is an example of such a copper-based ferrite. In a preferred embodiment, the composite provides electromagnetic interference suppression up to at least 1 GHz.

The ferroelectric-ferromagnetic composite materials disclosed in the patents referred to above have been successful in providing optimal properties for both capacitive and inductive filtering for EMI/RFI suppression. However, these patents do not discuss specific metallization and electrode configurations for a surface mounted EMI/RFI filter that incorporates both capacitive elements and inductive elements for the same dielectric made from the composite. It is an object of the present invention to provide a combination of both capacitive and inductive components in connection with a common ferroelectric-ferromagnetic composite for this purpose.

SUMMARY OF THE INVENTION

In accordance with the teachings of the present invention, an EMI filter is disclosed that makes use of a common ferroelectric-ferromagnetic composite in connection with capacitive and inductive elements. The geometrical structure of the filter is such that the electric fields and magnetic fields generated by the capacitive and inductive elements simultaneously penetrate the entire volume of the composite. The capacitive plates are aligned with the magnetic field, or are split to avoid setting up eddy currents in the plates which oppose the penetration of magnetic flux through the dielectric.

Various structural designs can be provided to define the capacitive elements and the inductive elements in different configurations relative to the composite to satisfy the desirable requirements. One particular design includes providing a slab of the composite having plates on opposite sides of the slab that define capacitors, and a conductive strip wrapped around the slab and electrically connected to the hot capacitive plates that define the inductor. This basic configuration can be extended to a cylinder made of the composite where a ground plane is provided on one surface of the cylinder, and the hot capacitor plates are provided on the other surface of the cylinder, where a conductive strip on the other surface defines the coil. A multilayer filter can be provided that includes layered substrates, where metallized vias extending through the substrates define a coil, and ground planes and capacitive plates on alternating substrates define the capacitive elements.

Additional objects, advantages and features of the present invention will become apparent from the following description and appended claims, taken in conjunction with the accompanying drawings.

DESCRIPTION OF THE PREFERRED EMBODIMENT

The following discussion of the preferred embodiment directed to various configurations for both ferroelectric and ferromagnetic EMI/RFI filter configurations is merely exemplary in nature, and is in no way intended to limit the invention or its applications or uses.

Many types of geometrical configurations that employ capacitive and inductive elements, and make use of the ferroelectric-ferromagnetic composite of the type discussed above in the '129, '196, '748 and '770 patents can be provided in accordance with the teachings of the present invention. The geometrical structures provided by the capacitive and inductive elements and the ferroelectric-ferromagnetic composite are such that the electric fields and magnetic fields generated by the capacitive and inductive elements penetrate the volume of the composite. This is necessary to achieve the greatest stored energy in the filter, thus achieving the greatest volumetric efficiency. Continuous conductive planes may not be perpendicular to the magnetic flux generated by the inductive elements. If the electric and magnetic fields are to be perpendicular, then the capacitive plates of the filter must be split. This is necessary to avoid setting up eddy currents in the plates which oppose the penetration of the magnetic flux through the material. Optimal construction of the filter is provided by having the electric and magnetic fields orthogonal to each other.

Figure 1:
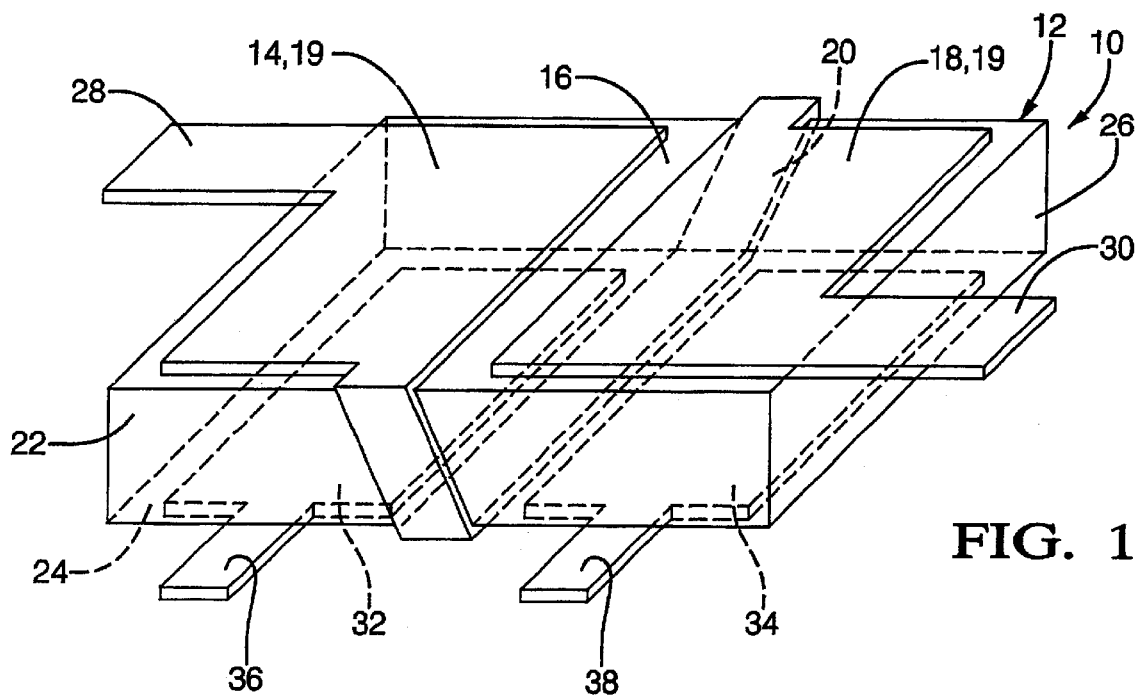
FIG. 1 is a perspective view of a single chip, low pass Pi filter, according to an embodiment of the present invention.

FIG. 1 is a perspective view of an EMI/RFI filter 10 that employs a dielectric slab 12 made of a ferroelectric-ferromagnetic composite that has the features referred to above. Specially patterned surface metals are formed on the slab 12 by any suitable metallization process to provide both capacitive and inductive elements that make use of the dielectric member or slab 12. Particularly, a first metallic positively charged capacitor plate 14 is formed at one side on a second or top surface 16 of the slab 12 and a second metallic positively charged capacitor plate 18 is formed at an opposite side on the top surface 16 of the slab 12. The plates 14 and 18 form a capacitor plate pair 19 and are electrically connected by a metal strip 20 that defines an inductive winding or loop. The strip 20 is connected to the first positively charged capacitor plate 14, extends down a front side 22 of the slab 12, extends along a first or bottom surface 24 of the slab 12, extends up a back surface 26 of the slab 12 and is connected to the second positively charged capacitor plate 18, as shown. In alternate designs, the strip 20 can wrap around the slab 12 multiple times.

An input tab 28 is electrically connected to the first positively charged capacitor plate 14 and an output tab 30 is electrically connected to the second positively charged capacitor plate 18. Additionally, a first bottom ground plate 32 is formed at one side of the bottom surface 24 and a second bottom ground plate 34 is formed on an opposite side of the bottom surface 24. The strip 20 is electrically isolated from and runs between the plates 32 and 34 on the bottom surface 24, as shown. A ground tab 36 is connected to the plate 32 and a ground tab 38 is connected to the plate 34.

Figure 2:
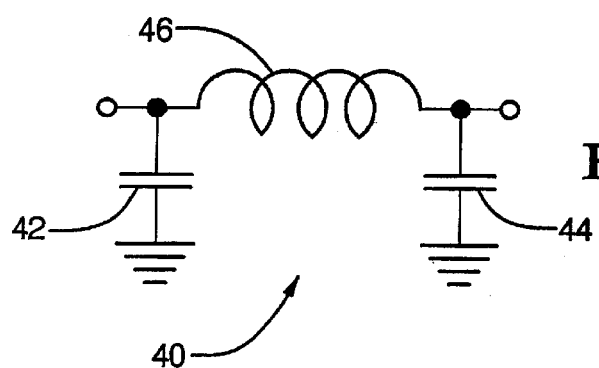
FIG. 2 is a schematic diagram of an equivalent circuit for the low pass filter shown in FIG. 1.

The configuration as just described defines two capacitors and an inductor, whose equivalent electrical circuit 40 is shown by the schematic diagram in FIG. 2. The circuit 40 is a low pass Pi filter that includes capacitors 42 and 44 and an inductor 46. The top plate 14 and the bottom plate 32 form the capacitor 42 and the top plate 18 and the bottom plate 34 form the capacitor 44. The electrical winding defined by the strip 20 around the slab 12 is the inductor 46. Of course, the configuration of the plates 14, 18, 32 and 34, and the strip 20 can be rotated to be on different sides of the slab 12 consistent with the discussion herein.

By connecting the tabs 36 and 38 to ground and applying a current source to the input tab 28, an electrical field is generated between the plates 14 and 32 and the plates 18 and 34, and a magnetic field is created in the slab 12 by the strip 20. The electrical fields generated by the plates 14 and 32 and the plates 18 and 34 are defined through the slab 12 between the top surface 16 and the bottom surface 24, and the magnetic field generated by the winding strip 20 is perpendicular to the electric field across the slab 12, as defined by the right-hand rule. By making the magnetic field through the slab 12 so that it does not impinge the plates 14, 18, 32 and 34, eddy currents are prevented from being generated in the plates which would adversely effect device operation.

Figure 3:
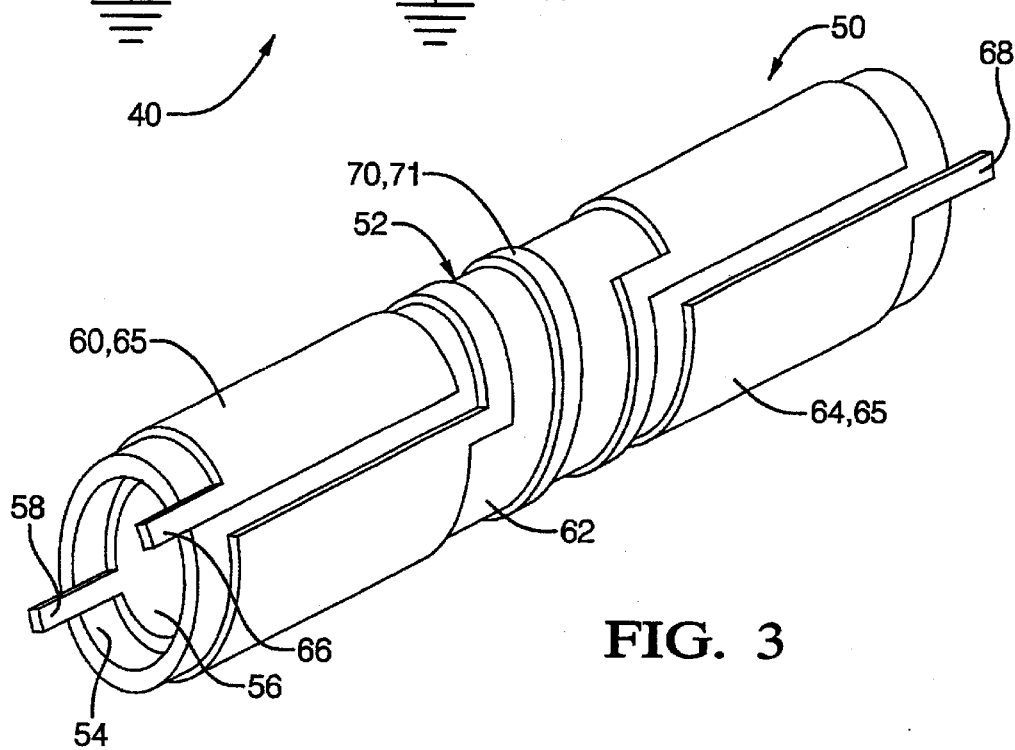
FIG. 3 is a perspective view of another low pass Pi filter that is based on hollow cylinder ceramic extrusion technology, according to another embodiment of the present invention.

FIG. 3 is also a low pass Pi filter 50 of the type shown in FIG. 1 and having the same equivalent circuit as shown by the circuit 40, that is based on hollow cylinder ceramic extrusion technology. In this embodiment, the ferroelectric-ferromagnetic composite is formed into a hollow cylinder or tube 52 by an extrusion process. An internal surface 54 of the cylinder 52 is metallized with an inner metal layer or plate 56, and is a ground plate for the filter 50. A ground tab 58 provides a ground connection to the cylindrical ground plate 56. A first outer metal layer or cylindrical positively charged capacitor plate 60 is wrapped around an outer surface 62 at one end of the cylinder 52 and a second outer metal layer or cylindrical positively charged capacitor plate 64 is wrapped around the outer surface 62 at an opposite end of the cylinder 52, as shown. The first capacitor plate or outer metal layer 60 and the second capacitor plate or outer metal layer 64 form a capacitor plate pair 65. Tab 66 provides an electrical connection to the outer layer 60 and tab 68 provides an electrical connection to the outer layer 64. The combination of the outer layer 60 and the inner layer 56 define the capacitor 42, and the combination of the outer layer 64 and the inner layer 56 define the capacitor 44 of the circuit 40.

The inductive element of the filter 50 is defined by a conductive strip or coil 70 that is connected to the outer layer 60, wraps around the outer surface 62 of the cylinder 52 a number of times forming a number of windows 71, and is electrically connected to the outer layer 64. Alternately, the ground plane can be formed on the outer surface 62 of the cylinder 52, and the separated capacitor plates can be provided on the internal surface 54 of the cylinder 52. In both the cylindrical design embodiments, the ground layer 56 can be continuous for both the layers 60 and 64.

The number of windings 71 of the strip 70 around the cylinder 52 can vary from design to design. The electric field and the magnetic field are again perpendicular, where the electric field is defined through the cylinder 52 between the inner layer 56 and the outer layers 60 and 64, and the magnetic field extends in the direction of the cylinder 52. Once again, this design prevents eddy currents from being generated in the inner layer 56 and the outer layers 60 and 64.

Figure 4:
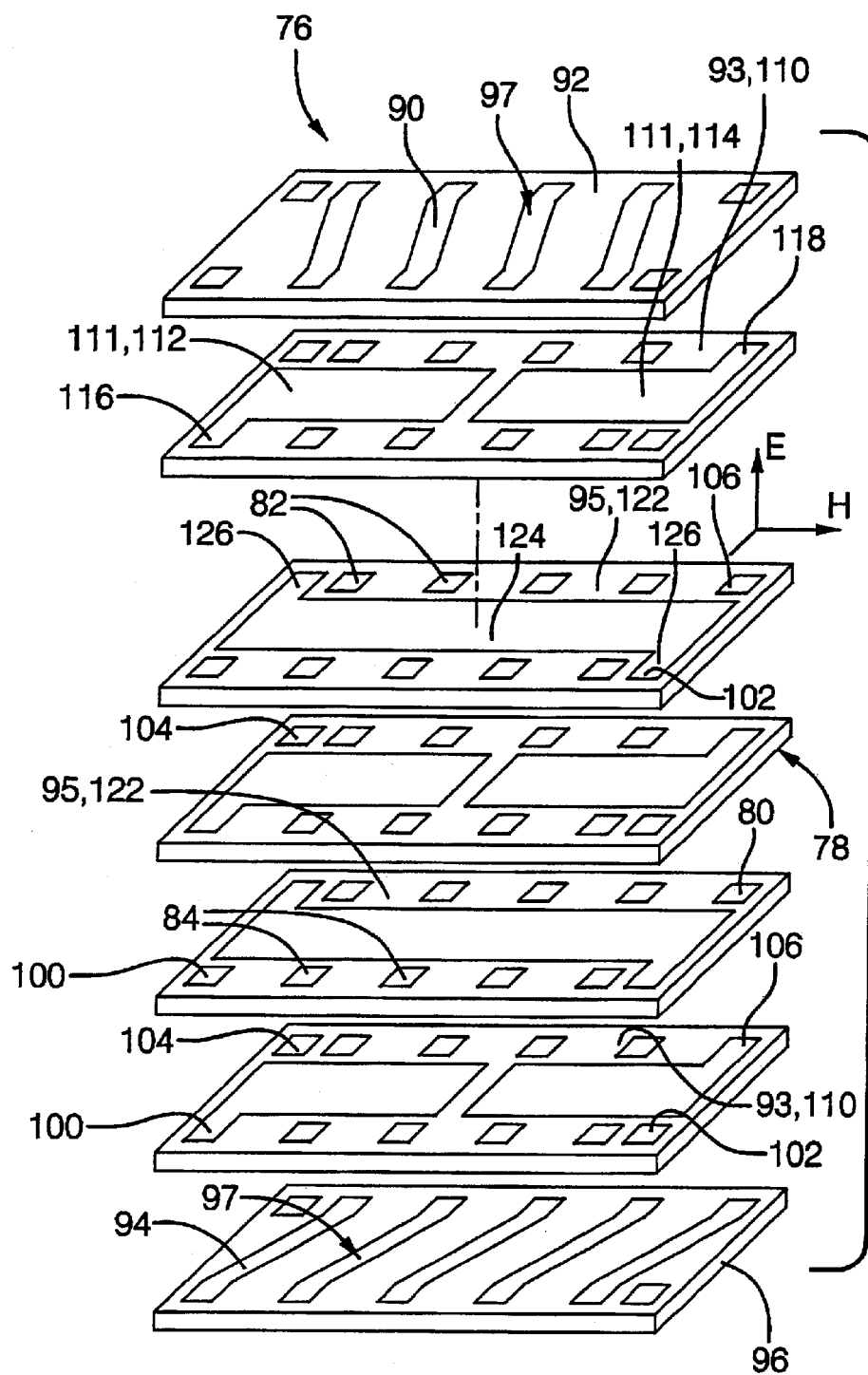
FIG. 4 is an exploded perspective view of a multiple layer ExH filter, according to an embodiment of the present invention.

FIG. 4 is an exploded perspective view of a multi-layer ExH filter 76, according to another embodiment of the present invention. The filter 76 includes a plurality of layered ferroelectric-ferromagnetic composite substrates 78 made of the material described above. The substrates 78 are planar plates having a thickness optimized for a particular application. Substrates 78 comprise a top and bottom substrate 92 and 96 with at least one alternating hot substrate 93 and ground substrate 95 disposed there between. The substrates 78 would be adhered together to form a multi-layered circuit by any suitable fabrication process. In this example, seven substrates 78 are shown to represent this embodiment, with the understanding that more or less substrates 78 can also be incorporated. The specific composition of each substrate 78 can vary from substrate to substrate in accordance with a specific design.

The top, capacitor, and ground substrates 92, 93 and 95 each include eight metallic coil vias 80 extending therethrough, where four spaced-apart vias 82 extend along a back-edge of the substrates 78 and four spaced-apart vias 84 extend along a front-edge of the substrates 78. Eight coil vias 80 are used in this embodiment as a non-limiting example, in that other designs can provide more or less vias 80, consistent with the discussion herein. When the top, capacitor and ground substrates 92, 93 and 95 are mounted together, each back-edge via 82 of a particular substrate 78 aligns with the respective back-edge via 82 of the adjacent substrate 78, and each front-edge via 84 aligns with the respective front-edge via 84 of the adjacent substrate 78.

Slanted metallic strips of strip portions 90 are provided on the top substrate 92 to electrically connect selected back-edge vias 82 and front-edge vias 84 on the substrate 92, and counter-slanted metallic strips or strip portions 94 are provided on the bottom substrate 96 to also connect selected front-edge vias 82 and back-edge vias 84 on the substrate 96. Particularly, each of the strips 90 and 94 electrically connect the particular front-edge via 84 and the particular back-edge via 82 on the substrate 92 and 96 to be shifted over one via position. This configuration of the back-edge vias 82 and the front-edge vias 84 and the strips 90 and 94 define a coil 97 that is embedded within and wraps around the substrates 78.

The substrate 78 have one corner or first hot plate via 100 as an input via and an opposite corner via 102 along the same lateral front edge is a ground via. Likewise, one corner via 104 along the lateral back edge is a ground via and the other corner or second hot plate via 106 along the same lateral back edge is an output via, where the input and output vias are diagonally opposed and the two ground vias are diagonally opposed. The strips 90 and 94 cause each of the corner vias 100 and 106 to be connected together.

The substrates 78 have one corner or first positively charged capacitor plate via 100 as an input via and an opposite corner via 102 along the same lateral front edge is a ground via. Likewise, one corner via 104 along the lateral back edge is a ground via and the other corner or second positively charged capacitor plate via 106 along the same lateral back edge is an output via, where the input and output vias are diagonally opposed and the two ground vias are diagonally opposed. The strips 90 and 94 cause each of the corner vias 100 and 106 to be connected together.

Figure 5:
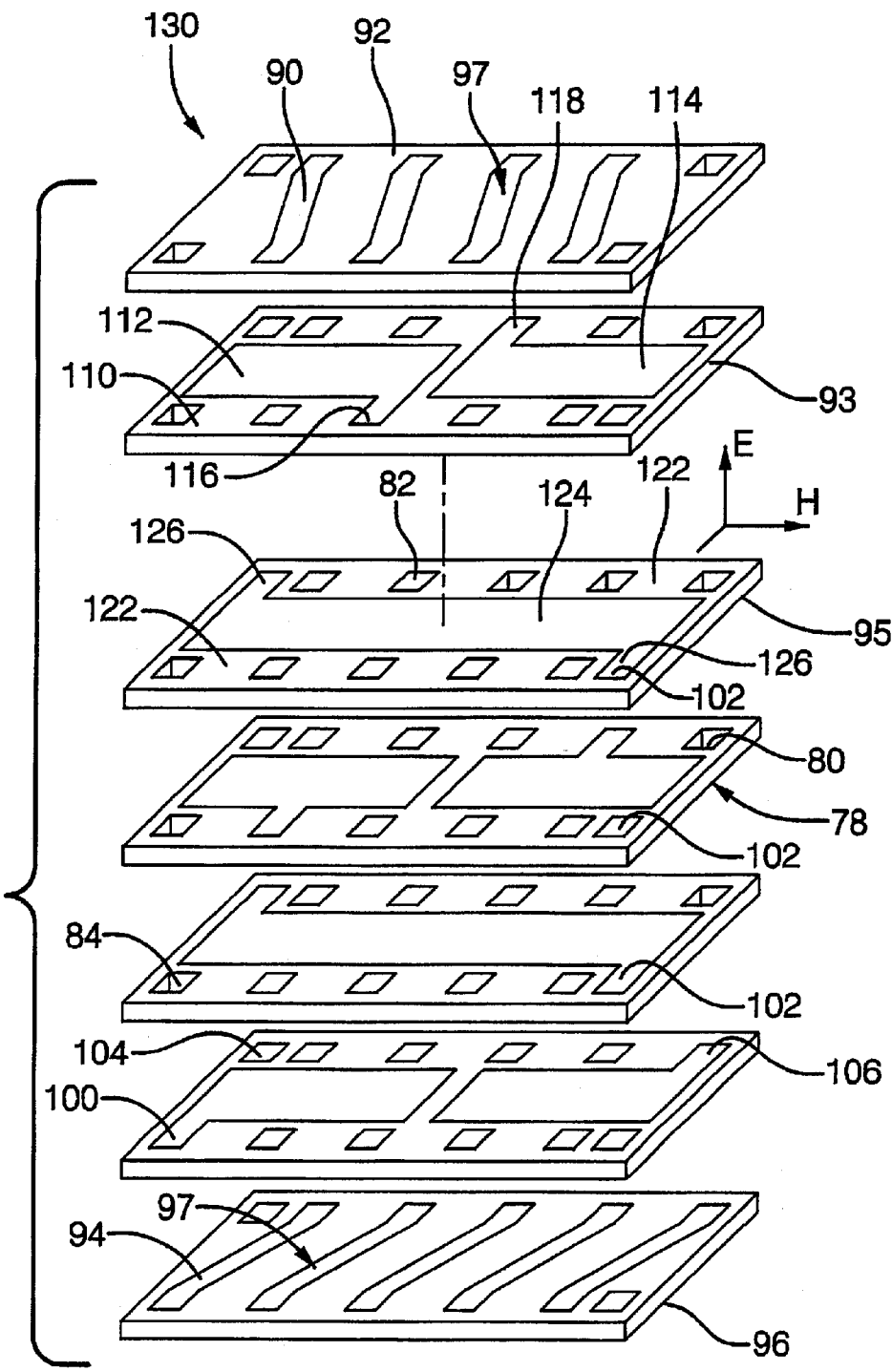
FIG. 5 is an exploded perspective view of a multi-layer ExH filter, according to another embodiment of the present invention.

An upper surface 110 of the capacitor substrates 93 between the top and bottom substrates 92 and 96 include at least one positively charged capacitor plate 111 and preferably a first and second metallic positively charged capacitor plates 112 and 114 that are separated and together form one of a plurality of positively charged capacitor plate pairs 115. The capacitor plates 112 and 114 include tabs 116 and 118, respectively, that are electrically connected to the corner vias 100 and 106, respectively, for each capacitor substrate 93, as shown. An upper surface 122 of the ground substrate 95 between the top and bottom substrates 92 and 96 includes a continuous metallized ground plane or plate 124. The ground plates 124 include tabs 126 that are electrically connected to the ground corner vias 102 and 104, as shown. Therefore, each of the ground plates 124 are connected to ground through the corner vias 102 and 104, and each of the capacitor plates 112 and 114 are electrically connected to an input or output via. Thus, every combination of ground plate 124 and capacitive plate 112 or 114 defines a capacitor to provide multiple capacitive layer. As above, the electric field extends through the substrates 78, and the magnetic field is orthogonal to the electric field in a direction between the substrates 78. FIG. 5 is an exploded perspective view of another ExH filter 130 similar to the filter 76 described above. In this embodiment, like elements are identified with the same reference numeral. As is apparent in this design, the tabs 116 and 118 connecting the capacitive plates 112 and 114 to the corner vias 100 and 106 vary from capacitive plate to capacitive plate to provide a distributed system. In other words, the tabs 116 and 118 vary from being connected to the corner vias 100 and 106, to one of the back-edge vias 80 or the front-edge vias 84, as shown. This provides a variation in the capacitive and inductive orientation of the "filter", 130, and in effect provides a CLCLCL . . . CL circuit.

Each of the filters discussed above provide geometrical structures that cause the electric fields and magnetic fields of the filter to penetrate the entire particular ferroelectric-ferromagnetic volume. This is necessary to achieve the greatest stored electric and magnetic energy in the filter, thus achieving the greatest volumetric efficiency. Additionally, the continuous conductive planes may not be perpendicular to the magnetic flux. If the electric and magnetic fields are to be parallel, then the capacitive plates must be split. This is necessary to mitigate eddy currents which oppose the penetration of magnetic flux through the ferroelectric-ferromagnetic composite. The optimum performance arises by providing the electric fields and magnetic fields to be orthogonal. Also, it should be noted that the invention described above can be used for different types of filters, including low pass, high pass, band pass and band trap filters. One skilled in the art would recognize that altering the metallization of the filter could change the filter type.

The foregoing discussion discloses and describes merely exemplary embodiments of the present invention. One skilled in the art will readily recognize from such discussion, and from the accompanying drawings and claims, that various changes, modifications and variations can be made therein without departing from the spirit and scope of the invention as defined in the following claims.

What is claimed is:

1. An EMI filter comprising:
    a ferroelectric-ferromagnetic composite member exhibiting both capacitive and inductive properties;
    a ground plate formed on a first surface of the member;
    a capacitor plate pair having a first capacitor plate and a second capacitor plate, the capacitor plate pair formed on a second surface of the member, wherein the combination of the first capacitor plate and the ground plate separated by the member defines a first capacitor and the combination of the second capacitor plate and the ground plate separated by the member defines a second capacitor; and
    an inductive coil having at least one metallic winding formed on the member, the coil being in electrical contact with the first capacitor plate and the second capacitor plate, the coil disposed between the first and second capacitors, the area of the coil disposed laterally outward from the ground plate being substantially less than the area of the capacitor plate pair disposed laterally outward from the ground plate.

2. The filter according to claim 1 wherein the first and second capacitors define an electric field and the coil defines a magnetic field, the electric and magnetic fields penetrating the member and disposed orthogonal to each other.

3. The filter according to claim 1 wherein the composite member comprises about 30% to about 70% by volume of a ferroelectric material, and about 30% to about 70% by volume of a ferromagnetic material.

4. The filter according to claim 3 wherein the ferromagnetic material comprises an $AB_2O_4$ material where A is selected from the group consisting of Cu, Mg, Zn, Ni and Mn, and B includes primarily Fe.

5. The filter according to claim 3 wherein the ferromagnetic material comprises $Cu_{0.2}Mg_{0.4}Zn_{0.5}Fe_2O_4$.

6. The filter according to claim 3 wherein the member has a closed pore porosity ranging from about 0% to about 10% by volume of the dielectric member.

7. The filter according to claim 6 wherein the member includes a copper-based ferrite.

8. The filter according to claim 3 wherein the member includes grains of a ferroelectric material and grains of a ferromagnetic material which are combined, intermixed and consolidated to form the member such that the ferroelectric and ferromagnetic grains substantially retain their respective discrete electromagnetic properties.

9. The filter according to claim 3 wherein the ferroelectric portion of the member is selected from the group consisting of barium strontium titanate, barium strontium niobate, barium copper tantalate and barium titanate.

10. An EMI filter comprising:
    a ferroelectric-ferromagnetic composite member exhibiting both capacitive and inductive properties;
    a ground plate pair having a first ground plate and a second ground plate, the ground plate pair formed on a first surface of the member;
    a capacitor plate pair having a first capacitor plate and a second capacitor plate, the capacitor plate pair formed on a second surface of the member, wherein the combination of the first capacitor plate and the first ground plate separated by the member defines a first capacitor and the combination of the second capacitor plate and the second ground plate separated by the member defines a second capacitor;
    an inductive coil having at least one metallic winding formed on the member, the coil being in electrical contact with the first capacitor plate and the second capacitor plate, the coil disposed between the first and second capacitors; and
    wherein the member is a slab, the first surface is a bottom surface, the second surface is a top surface, and wherein the coil is wrapped around the slab and extends between the first and second ground plates upon the bottom surface flush with the first and second ground plates.

11. An EMI filter comprising:
    a ferroelectric-ferromagnetic composite member exhibiting both capacitive and inductive properties;
    a ground plate formed on a first surface of the member;
    a capacitor plate pair having a first capacitor plate and a second capacitor plate, the capacitor plate pair formed on a second surface of the member, wherein the combination of the first capacitor plate and the ground plate separated by the member defines a first capacitor and the combination of the second capacitor plate and the ground plate separated by the member defines a second capacitor;
    an inductive coil having at least one metallic winding formed on the member, the coil being in electrical contact with the first capacitor plate and the second capacitor plate, the coil disposed between the first and second capacitor plates; and;
    wherein the member is a hollow tube, the first surface is an inner surface of the tube, the second surface is an outer surface of the tube, the ground plate is a cylindrical ground plate, the first and second capacitor plates are formed on opposite ends of the outer surface of the tube, and wherein said coil is wrapped around a center portion of the outer surface of the tube between the first and second capacitor plates.

12. An EMI filter comprising:
    a ferroelectric-ferromagnetic member that includes a composite material exhibiting both capacitive and inductive properties, said member including a first surface and an opposing second surface;
    at least one metallic ground plate formed on the first surface of the member;
    a first capacitor plate and a second capacitor plate formed on the second surface of the member, wherein the combination of the first capacitor plate and the ground plate defines a first capacitor and the combination of the second capacitor plate and the ground plate defines a second capacitor;
    a metallic strip formed on the member and being an inductive coil, said strip being electrically connected to both the first capacitor plate and the second capacitor plate; and
    wherein the member is a composite slab and the at least one ground plate is a first ground plate and a second ground plate formed on the first surface of the slab and the first and second capacitor plates are formed on the second surface of the slab, and wherein the strip is wrapped around the slab and extends between and is flush with the first and second ground plates.

13. A method of providing EMI filtering, said method comprising the steps of:
    providing a ferroelectric-ferromagnetic member that is a composite material exhibiting both capacitive and inductive properties wherein the member is a slab;
    forming at least one metallic ground plate on the slab, wherein the at least one ground plate is a first ground plate and a second ground plate formed on one surface of the slab;
    forming a plurality of capacitor plates on the slab in a manner so that each one of the plurality of capacitor plates and one of the at least one ground plate defines a respective capacitor of a plurality of capacitors, and wherein the step of forming a plurality of capacitor plates includes forming a first and a second capacitor plate on an opposite surface of the slab so that the strip is wrapped around the slab and extends flush between the first and second ground plates; and
    forming at least one metallic strip on the slab to provide an inductive coil where the metallic strip is in electrical contact with the plurality of capacitor plates.

14. An EMI filter comprising:
    a bottom substrate;
    a top substrate disposed above the bottom substrate;
    at least one capacitor substrate disposed between the top and bottom substrates;
    at least one ground substrate stacked alternately with the at least one capacitor substrates and between the top and bottom substrates, the top substrate, the bottom substrate, the at least one capacitor substrate and the at least one ground substrate are made of a ferroelectric-ferromagnetic composite exhibiting both capacitive and inductive properties;
    a metallic ground plate formed on an upper surface of each respective one of the at least one ground substrates;

a first capacitor plate formed on an upper surface of each respective one of the at least one capacitor substrates;

a second capacitor plate formed on the upper surface of each respective one of the at least one capacitor substrates, the first capacitor plate isolated electrically from the second capacitor plate;

a coil having at least one metallic winding, each winding having a slanted top metallic strip disposed on an upper surface of the top substrate, a counter-slanted bottom metallic strip disposed on an upper surface of the bottom substrate and a plurality of front and back-edge coil vias aligned vertically and laterally penetrating the top substrate, the at least one capacitor substrates and the at least one ground substrates to interconnect the respective front and back ends of the top strips to the front and back ends of the bottom strips, the coil being in electrical contact with one of the first capacitor plates and one of the second capacitor plates and the coil being isolated electrically from the ground plates; and wherein each of the at least one ground substrates and each of the at least one capacitor substrates have a first and a second capacitor plate tab and via, the tab projecting from and co-planar to the respective capacitor plate, the first capacitor plate vias interconnected electrically and laterally to distal ends of the first capacitor plate tabs, the second capacitor plate vias interconnected electrically and laterally to distal ends of the second capacitor plate tabs.

15. The filter according to claim 14 wherein the first capacitor plates are aligned vertically to one another and the second capacitor plates are aligned vertically to one another.

16. The filter according to claim 15 wherein the first capacitor plate vias are vertically aligned to one another and the second capacitor plate vias are vertically aligned to one another.

17. The filter according to claim 16 wherein the first and second capacitor plate vias are disposed at opposite corners of both the at least one capacitor substrate and the at least one ground substrate.

18. The filter according to claim 17 wherein each ground plate has a ground tab projecting from and co-planar to the ground plate, and wherein each of the at least one ground substrates and each of the at least one capacitor substrates have at least one ground plate via electrically interconnecting the distal ends of the ground tabs of the ground plates.

19. The filter according to claim 18 wherein the at least one ground plate vias are aligned vertically to one another.

20. The filter according to claim 19 wherein the ground plates are aligned vertically to one another.

21. The filter according to claim 20 wherein the at least one ground plate vias are two ground plate vias disposed at opposite corners of the at least one ground substrate and the at least one capacitor substrate not containing the first and second capacitor plate vias.

22. A multi-layered EMI filter comprising a plurality of magnetic-dielectric substrates including a top substrate, a bottom substrate, a plurality of capacitor substrates, and a plurality of ground substrates, the capacitor and ground substrates disposed alternately between the top and bottom substrates, each of the plurality of substrates includes a plurality of metallic vias having a plurality of back and a plurality of front edge vias and the top substrate and the bottom substrate include metallic strip portions that interconnect each respective one of the plurality of back and front edge vias to define an inductive coil, and each one of the plurality of capacitor substrates include at least one capacitor plate and each one of the plurality of ground substrates includes a ground plate, wherein each one of the at least one capacitor plate of each one of the plurality of capacitor substrates are each connected to the coil by a plurality of common vias of the plurality of vias and each of the plurality of ground plates are electrically isolated from the coil;

the ground plate from each one of the plurality of ground substrates having a tab projecting from and co-planar to the ground plate, the ground plates being stackably engaged electrically by a plurality of common vias of the plurality of vias projecting laterally from either side of a distal end of the ground tabs; and each one of the at least one capacitor plates having a tab projecting from and co-planar to the respective capacitor plate, the plurality of capacitor plates being stackably engaged electrically by a plurality of common vias projecting laterally from either side of a distal end of the capacitor tabs.

23. The filter according to claim 22 wherein the at least one capacitor plate from each one of the plurality of capacitor substrates includes a first capacitor plate interconnected by a plurality of common metallic vias through each one of the plurality of substrates and a second capacitor plate interconnected by another plurality of common vias through each one of the plurality of substrates.

24. The filter according to claim 22 wherein the at least one capacitor plate and the coil define an electric field and a magnetic field, respectively, that are orthogonal to each other and penetrate the substrates.

25. The filter according to claim 22 wherein the at least one capacitor plate from each one of the plurality of capacitor substrates includes a first and second capacitor plate connected to varying metallic vias to define a distributed filter system.

26. The filter according to claim 25 wherein the plurality of vias are formed through the plurality of substrates along opposite edges of the plurality of substrates.

27. The filter according to claim 26 wherein a first and a second diagonally opposing corner capacitor plate vias are electrically connected to the respective first and second capacitor plates and the coil, and another set of diagonally opposing corner ground plate vias are connected to the ground plates.

\* \* \* \* \*